United States Patent [19]

Shin

[11] Patent Number: 5,196,733

[45] Date of Patent: Mar. 23, 1993

[54] CROSSTALK-RESISTANT MULTI-INPUT TO SINGLE OUTPUT ANALOG SWITCHING DEVICE

[75] Inventor: Young-ho Shin, Pucheon, Rep. of Korea

[73] Assignee: Samsung Electronics Co., Ltd., Kyunggi, Rep. of Korea

[21] Appl. No.: 855,546

[22] Filed: Mar. 20, 1992

[30] Foreign Application Priority Data

Jul. 2, 1991 [KR] Rep. of Korea ............. 91-11215[U]

[51] Int. Cl.$^5$ ..................... H04Q 3/00; H03K 17/56
[52] U.S. Cl. ..................... 307/243; 328/104; 328/154; 328/137
[58] Field of Search ............. 307/491, 241, 243, 529; 328/104, 154, 137; 370/112

[56] References Cited

U.S. PATENT DOCUMENTS

| | | | |
|---|---|---|---|
| 3,838,296 | 9/1974 | McLeod | 328/104 |
| 3,914,620 | 10/1975 | Millhollan et al. | 307/241 |
| 4,897,836 | 1/1990 | Fitzpatrick et al. | 307/243 |
| 4,910,466 | 3/1990 | Kiuchi et al. | 328/104 |

FOREIGN PATENT DOCUMENTS 2046546  2/1979  United Kingdom .

Primary Examiner—William L. Sikes
Assistant Examiner—Toan Tran
Attorney, Agent, or Firm—Cushman, Darby & Cushman

[57] ABSTRACT

A crosstalk-resistant multi-input to single output analog switching device is provided to prevent an appearance of a unwanted input signal at an output stage when any one of a diverse switches is selected in particular electronic and or electric products attached thereto. The analog switching device has an additional provision of a second reference voltage source and a second selective switch unit, thereby avoiding crosstalk generation by electrically blocking a signal transfer path between a selected input port and a non-selected input port. Furthermore, upon selectively turning on and off transistor switches, a pulse noise resulting form a change in bias voltage can be eradicated.

12 Claims, 5 Drawing Sheets

CROSSTALK-RESISTANT MULTI-INPUT TO SINGLE OUTPUT ANALOG SWITCHING DEVICE

BACKGROUND OF THE INVENTION

1. Field of the Invention

The present invention relates to a multi-input to single output analog switching device, and more particularly to an analog switching device adapted to prevent at an output stage the appearance of a undesired input signal from circuitry lines connected to a non-selected feature switch when selecting one from many feature switches used in diverse electronic and/or electric products.

2. Description of the Related Art

Recently in such electronic and/or electric products, there has been an attempt to make a wire arrangement so that audio signals from respective products can be transmitted to one output device through feature selection equipment. For example, when the home electronic and/or electric products such as a television set, a video set, an audio set and the like are provided in a home, respective loud speakers must be mounted on the corresponding products to let a user hear each audio source. This has given rise to an inefficiency in view of economics and occupied space. Thus, there is a need for a multi-input to single output analog switching device capable of selecting one audio source among various audio sources from diverse products to transmit the selected source to a single loud speaker system. If a feature switch for the television set is selected in the multi-input to single output analog switching device, the only audio signal transmitted from the television set is produced from the speaker system, while only an audio signal transmitted from the audio set is generated from the speaker system when a feature switch for the audio set is selected.

The conventional multi-input to single output analog switching device is shown in FIG. 1, and its operation will be described with reference to the drawing.

First, suppose that a first switch S1 in a selective switch unit 4 is selected by an output signal of a logic controller 5. When an analog input signal enters from a first input port IN1 of an input stage 1, a first differential amplifier A1 in a differential amplification unit 2 receives the entered analog input signal at its non-inverting terminal and amplifies it, providing the amplified signal to an output stage 8 via a common load stage 3 connected to the output of first differential amplifier A1. However, in the selection of the first switch S1, if another analog input is also applied to a second input port IN2 when the analog input signal was applied to first input port IN1, the another analog input signal is fed to the non-inverting terminal of first differential amplifier A1 through bias resistors RB1 and RB2 of resistor unit 6, and thus appears at the output stage 8 via common load stage 3. This means that, when the analog input signal is not applied to the first input port IN1 but another analog input signal is applied to the second input port IN2, this other analog input signal appears at the output via circuitry lines connected to a non-selected feature switch and a differential amplifier connected to a selected feature switch. As a result, a crosstalk phenomenon may take place.

In FIG. 1, among the unexplained reference numerals, "Vref1" denotes a reference voltage source for differential amplification unit 2, "Ri1" denotes an internal resistor of the reference voltage source, "I" denotes a current source as a bias supply source of the differential amplification unit 2, "RB1 through RB5" denote first through fifth bias resistors, "A1 through A5" denote first through fifth differential amplifiers, "S1 through S5" denote first through fifth switches and "IN1 through IN5" denote first through fifth input terminals.

FIG. 2 shows a detailed circuit diagram of the device of FIG. 1, embodied as an integrated circuit.

As seen in FIG. 2, differential amplification unit 2 comprises a plurality of emitter-coupled differential amplifiers A1, A2, A3, A4 and A5 respectively including amplifying transistor pairs Q1 and Q2, Q4 and Q5, Q7 and Q8, Q10 and Q11, and Q13 and Q14, emitters of each transistor pair being connected to each other.

These differential amplifiers A1, A2, A3, A4 and A5 are enabled or disabled in response to the output signal of a logic controller 5 which controls switching transistors Q3, Q6, Q9, Q12 and Q15 forming a selective switch unit 4. That is, when any one of switching transistors Q3, Q6, Q9, Q12, and Q15 is selected with the output signal of logic controller 5, current from a constant current source I flows into the emitters of the corresponding transistors in the differential amplifier which is enabled due to the switching operation of the selected switching transistor because they are commonly connected to the constant current source I. The first differential amplifier A1 is, for example, driven when switching transistor Q3 of selective switch unit 4 is turned on in accordance with the output signal of logic controller 5, while the remaining switching transistors Q6, Q9, Q12 and Q15 are turned off. In doing so, second through fifth differential amplifiers A2, A3, A4 and A5 are inactive. When driving only switching transistor Q3, amplifying transistors Q1 and Q2 become operative, making signal amplification possible in the first differential transistor A1 when an analog input signal obtained from the first input port IN1 is applied. The amplified analog input signal then appears at output stage 8.

If a second analog input signal is applied to second input port IN2 of input stage 1, and in turn supplied to the base of amplifying transistor Q2 of differential amplifier A1 via bias resistors RB2 and RB1, then the second signal will be output from output stage 8 via common load 3 together with the just analog input signal passing through the first input port IN1, resulting in the generation of crosstalk.

At this point, let us calculate the generated amount of crosstalk from output stage 8. Initially and with reference to FIG. 1 and under a condition that a first switch S1 is shut closed and the other switches, i.e., second through fifth switches S2, S3, S4 and S5 are opened, the generated amount of crosstalk is given below when the analog input signal is applied only to second input port and not to first input port IN1.

$$Vct2 = \frac{Ri1}{RB2 + Ri1} Vi2 \qquad (1)$$

where Vct2 is the crosstalk-voltage appearing at output stage 8, Vi2 is an analog input voltage applied to second input port IN2, and Ri1 is an internal resistor included in a first reference voltage source Vref1.

Ideally, the multi-input to single output analog switching device should function so that the undesired analog input signal does not appear at output stage 8. However, a crosstalk phenomenon does occur in the above-mentioned multi-input to single output analog switching device. In the conventional multi-input to single output analog switching device, therefore, such a phenomenon happens in selection of switches other than the first switch S1, for example, while an analog input signal is applied to differential amplifier A1 connected to the first switch S1. To avoid the crosstalk phenomenon, either the internal resistor Ri1 of the first reference voltage source Vref1 must be set in resistance value or substantially attenuated to zero, or the bias voltage applied to respective differential amplifiers must be established from their corresponding independent reference voltage sources. However, this is very difficult to realize in practice.

SUMMARY OF THE INVENTION

It is an object of the present invention to provide a crosstalk-resistant multi-input to single output analog switching device having an additional provision of a second reference voltage source and a second selective switch unit connected between a differential amplification unit and first and second voltage sources for supplying the bias voltage to the differential amplification unit, thereby electrically isolating, with the switching operation of the second selective switch unit, a connection path between each of non-selected input ports and an enabled differential amplifier and preventing occurrence of crosstalk-phenomenon at an output stage.

To accomplish the object of the present invention, there is provided a crosstalk-resistant multi-input to single output analog switching device which includes an input stage having a plurality of input ports for receiving various analog input signals, a differential amplification unit connected to the input stage and having a plurality of differential amplifiers for amplifying the received analog input signals, a first selective switch unit connected to the differential amplification unit for performing a switching operation so that only one of the differential amplifiers is enabled and allows the corresponding analog input signal of the received analog input signals to be passed through the enabled differential amplifier transmitting it to an output stage, a first reference voltage source for supplying a first reference bias voltage to the differential amplification unit, a logic controller for controlling the first selective switch unit with its output signal, a constant current source being a bias supply source of the differential amplification unit and a common load connected to an output of the differential amplification unit for outputting the output of the differential amplification unit to the output stage. The crosstalk-resistant multi-input to single-output, analog switching device further comprises:

a second reference voltage source for supplying a bias voltage to the differential amplification unit; and a second selective switch unit connected between the first and second reference voltage sources and the differential amplification unit and having a plurality of switch pairs for performing a switching operation so that each bias voltage from the first and second reference voltage sources is selectively supplied to the corresponding differential amplifiers in accordance with the output signal of the logic controller.

More preferably, the potential level of the second reference voltage source is the same as that of the first reference voltage source.

In a more specific embodiment of the present invention, the crosstalk-resistant multi-input to single-output analog switching device is set up such that when either one of the differential amplifiers is enabled by the first selective switch unit, one switch of the switch pair of the second selective switch unit, connected to the enabled differential amplifier, is turned on to be electrically connected to the first reference voltage source and the other switch of the switch pair is turned off not to be electrically connected to the second reference voltage source. Similarly, while one switch of each of the switch pairs of the second selective switch unit, connected to respective disabled differential amplifiers, is turned off not to be electrically connected to the first reference voltage source, and the other switch of each of the switch pairs is turned on to be electrically connected to the second reference voltage source.

In a jet more specific embodiment of the present invention, the crosstalk-resistant multi-input to single-output analog switching device is set up such that one switch of each of the switch pairs in the second selective switch unit comprises a first switching transistor having its collector connected to the first reference voltage source, its base connected to the collector and its emitter connected to the differential amplification unit. In a second switching transistor, the collector is connected to the base of the first switching transistor, the emitter grounded through a resistor and the base connected to the logic controller.

Furthermore, the crosstalk-resistant multi-input to single output analog switching device is set up such that the other switch of each of the switch pairs in the second selective switch unit comprises a third switching transistor having its collector connected to the second reference voltage source, its base connected to the collector, and its emitter connected to the differential amplification unit, and a fourth switching transistor having its collector connected to the base of the third switching transistor, its emitter grounded through a resistor and its base connected to the logic controller.

The crosstalk-resistant multi-input to single-output analog switching devices of the present invention avoid the appearance of the unwanted input signal at the output stage in response to an enabled differential amplifier as discussed above.

BRIEF DESCRIPTION OF THE DRAWINGS

The above object and other features of the present invention will be more apparent from the following detailed description with reference to accompanying drawings, in which.

DETAILED DESCRIPTION OF THE PREFERRED EMBODIMENTS

Figure 3:
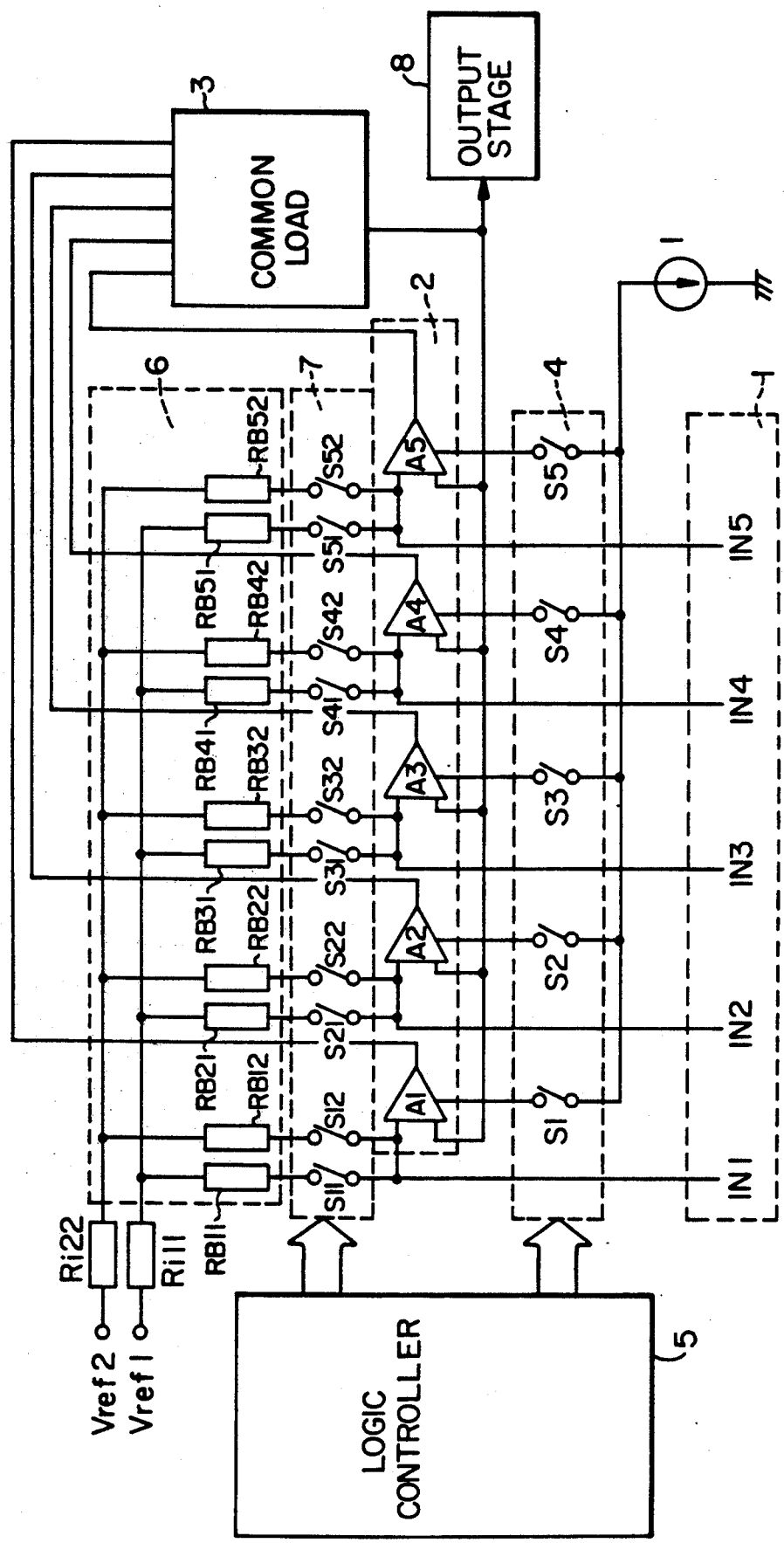
FIG. 3 shows a circuit diagram of an embodiment of a multi-input to single output analog switch device according to the present invention.

In FIG. 3, the overall configuration of the analog switching device according to the present invention is the same as that of the conventional analog switch circuit but for the provision of two reference voltage sources Vref1 and Vref2 and second selective switch unit 7 which selectively controls the supply of bias voltage to respective differential amplifiers A1, A2, A3, A4 and A5.

The switching operation of a second selective switch unit 7 by the output signal of a logic controller 5 will now be explained. In switch pair S11 and S12 connected to a first differential amplifier A1, the switch S11 connected to a first reference voltage source Vref1 is closed and the switch S12 connected to a second reference voltage source Vref2 is cut off, and simultaneously the switches S21, S31, S41, and S51 connected to the first reference voltage source Vref1, of the remaining switch pairs S21 and S22, S31 and S32, S41 and S42, and S51 and S52, are cut off, While the switches S22, S32, S42 and S52 which are respectively connected to the second reference voltage source Vref2 are turned on.

Meanwhile, when an analog input signal enters the non-inverting terminal of a first differential amplifier A1 via a first input port INI of an input stage 1, first differential amplifier A1 amplifies the entered input signal to be transmitted to an output stage 8 via the common load 3. Simultaneously, when another analog input signal is applied to a second input port IN2, the same signal is not applied to the non-inverting terminal of the first differential amplifier A1 due to the absence of electrical connection between each other, since, in switch pair S21 and S22 connected to a second differential amplifier A2, switch S21 connected to first reference voltage source Vref1 is cut off and switch S22 connected to the second reference voltage source Vref2 is turned on.

Figure 4:
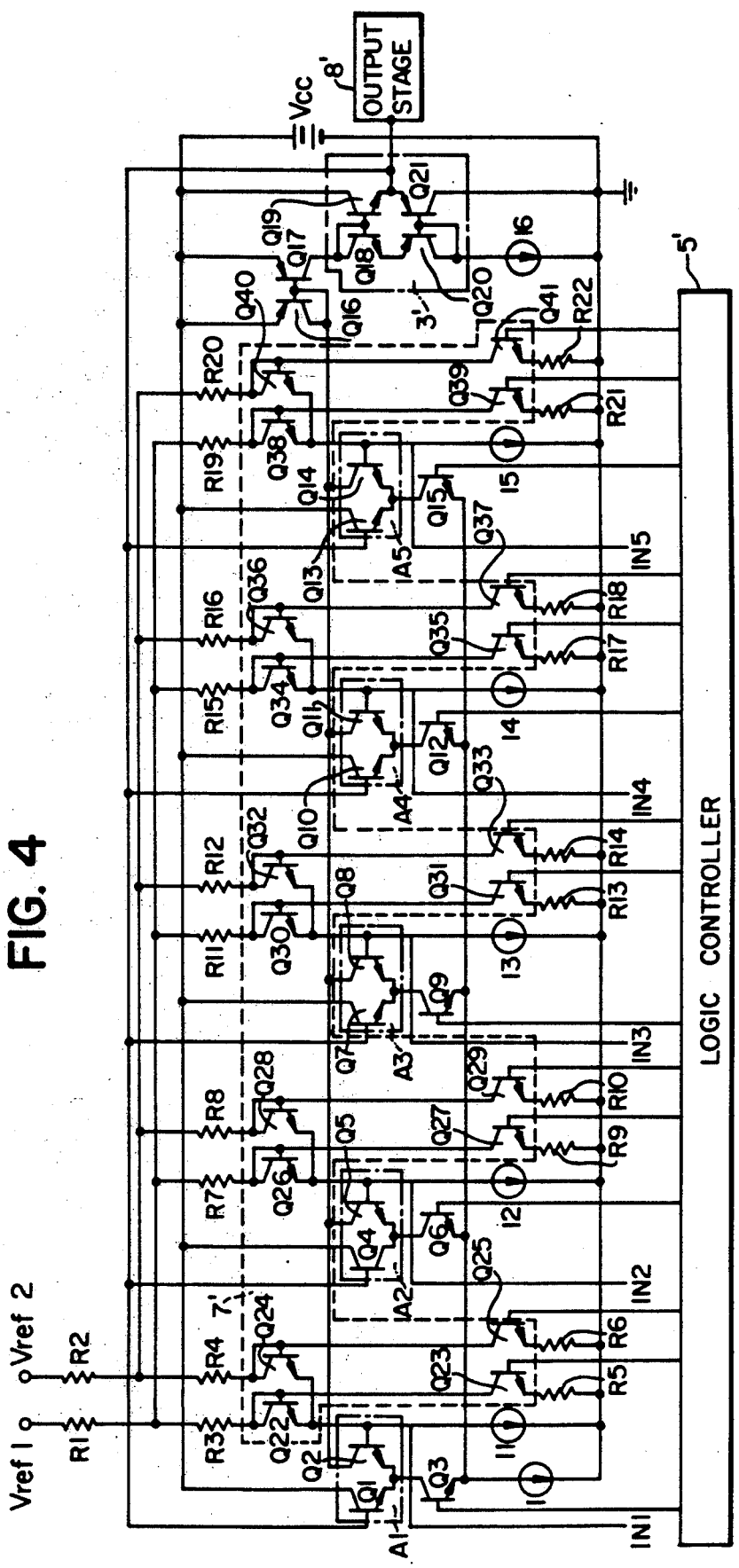
FIG. 4 shows a detailed circuit diagram of the device of FIG. 3.

In FIG. 4 which illustrates the analog switching device according to the present invention, transistors Q22 to Q41 form a second selective switch unit 7, and resistors R3 to R22 are bias resistors for the differential amplification unit 2.

Further, the switch pair S11 and S12 connected to the first differential amplifier A1 consists of switch transistors Q22 to Q25 and the switch pair S21 and S22 connected to the second amplifier A2 consists of switch transistors Q26 to Q29, while the switch pair S31 and S32 connected to the third differential amplifier A3 consists of switch transistors Q30 to Q33 and the switch pair S41 and S42 connected to the fourth differential amplifier A4 consists of switch transistors Q34 to Q37. Furthermore, the switch pair S51 and S52 connected to a fifth differential amplifier A5 consists of switch transistors Q38 to Q41.

Now, operation of the device according to the present invention will be illustrated in detail with reference to FIG. 4.

Figure 1:
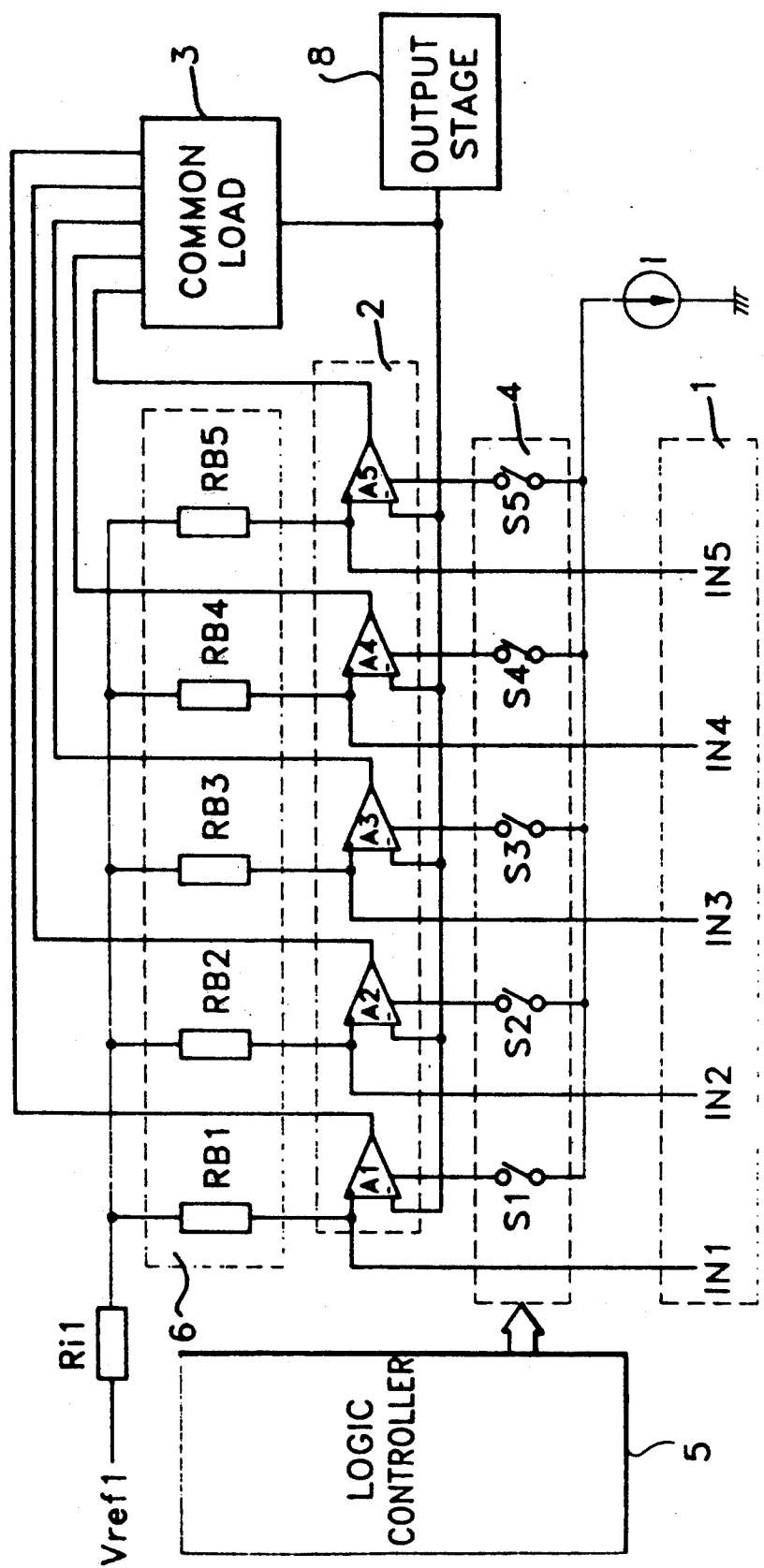
FIG. 1 shows a circuit diagram of a multi-input to single output analog switch device of the prior art.
Figure 2:
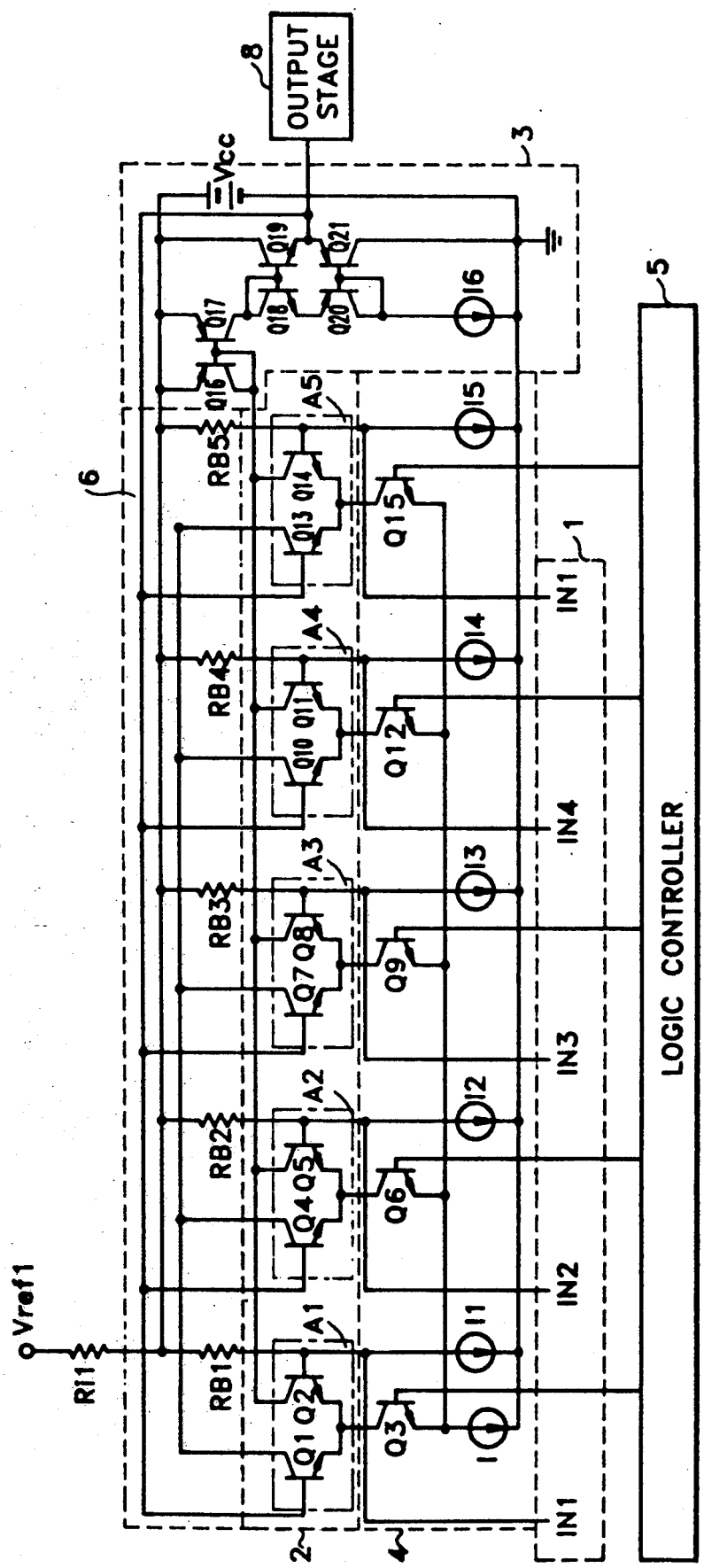
FIG. 2 shows a detailed circuit diagram of the device of FIG. 1.

The first differential amplifier A1 becomes active when third switch transistor Q3 corresponding to a switch S1 of first selective switch unit 4 shown in FIG. 3 is turned on in accordance with the output signal of logic controller 5. That is, current from a constant current source I flows on the emitters of amplifying transistors Q1 and Q2 forming first differential amplifier A1. At the same time, supplied with the bias voltage from first reference voltage source Vref1 is the first differential amplifier A1 to which switch pair S11 and S12 of FIG. 3 are connected, wherein switch S11 is closed down and switch S12 is cut off in accordance with the output signal of logic controller 5, i.e., switch transistors Q24 and Q25 of FIG. 3 are turned off. The remainder of differential amplifiers A2 to A5 is supplied with the bias voltage from second reference voltage source Vref2 because the corresponding switch pairs S21 & S22, S31 and S32, S41 and S42, and S51 and S52 connected to respective differential amplifiers A2 to A5 perform the opposite switching operation to that of the switch pair S11 and S12 connected to first differential amplifier A1. That is, when switching transistors Q28, Q29, Q32, Q33, Q36, Q37, Q40 and Q41 are turned on, switching transistors Q26, Q27, Q30, Q31, Q34, Q35, Q38 and Q39 are turned off. At this point, if the analog input signal is applied to first input port IN1 of input stage 1 (FIG. 1), the same signal appears at output stage 8 via the base of the amplifying transistor Q2 forming the first differential amplifier A1. Moreover, even if another analog signal is applied to second input port IN2, this other input signal cannot be present in output stage 8 because a signal transfer path is blocked so that the base of the amplifying transistor Q2 does not receive the applied other input signal to the second input port IN2. As a result, this prevents the unwanted input signal from appearing at the output stage 8. Namely, the enabled differential amplifier is connected to first reference voltage source Vref1, while the remainder of differential amplifiers, i.e., the disabled differential amplifiers, are connected to the second reference voltage source Vref2, such that the unwanted input signal is not applied to the enabled differential amplifier, thereby preventing crosstalk generation which is calculated with the ratio of the bias resistor of each of the input ports and the internal resistor of the reference voltage by the crosstalk equation (1) as explained hereinbefore.

Further, the analog switching device according to the present invention can avoid pulse noise due to the change of bias voltage upon turning a switch on or off, in which the voltage from the second reference voltage source is continuously supplied to the differential amplifier connected to each of the non-selected input port by the first selective switch unit, to thereby maintain a predetermined driving voltage for the differential amplifier. That is, in the input port which is not selected by first selective switch unit Vref1, the connection switch between first reference voltage source Vref1 and a differential amplifier connected to the non-selected input port is cut off. Thus, a bias voltage from the second reference voltage source is not supplied to the selected differential amplifier if the connection switch between the second reference voltage source Vref2 and the selected differential amplifier is cut off as in the analog switching device according to the present invention.

In this circumstance, suppose that respective input ports were connected to corresponding capacitors (not shown), then, the charge voltage on each capacitor drops. In the immediately following stage of operation, when the non-selected input port is then selected, a recharge time is required before normal operation because the charge voltage has already been discharged in the corresponding capacitor. Also, this results in a delay time and a pulse noise generating phenomenon which are eradicated by the continuous supply of bias voltage from second reference voltage source Vref2 to the disabled differential amplifier after the present invention.

Figure 5:
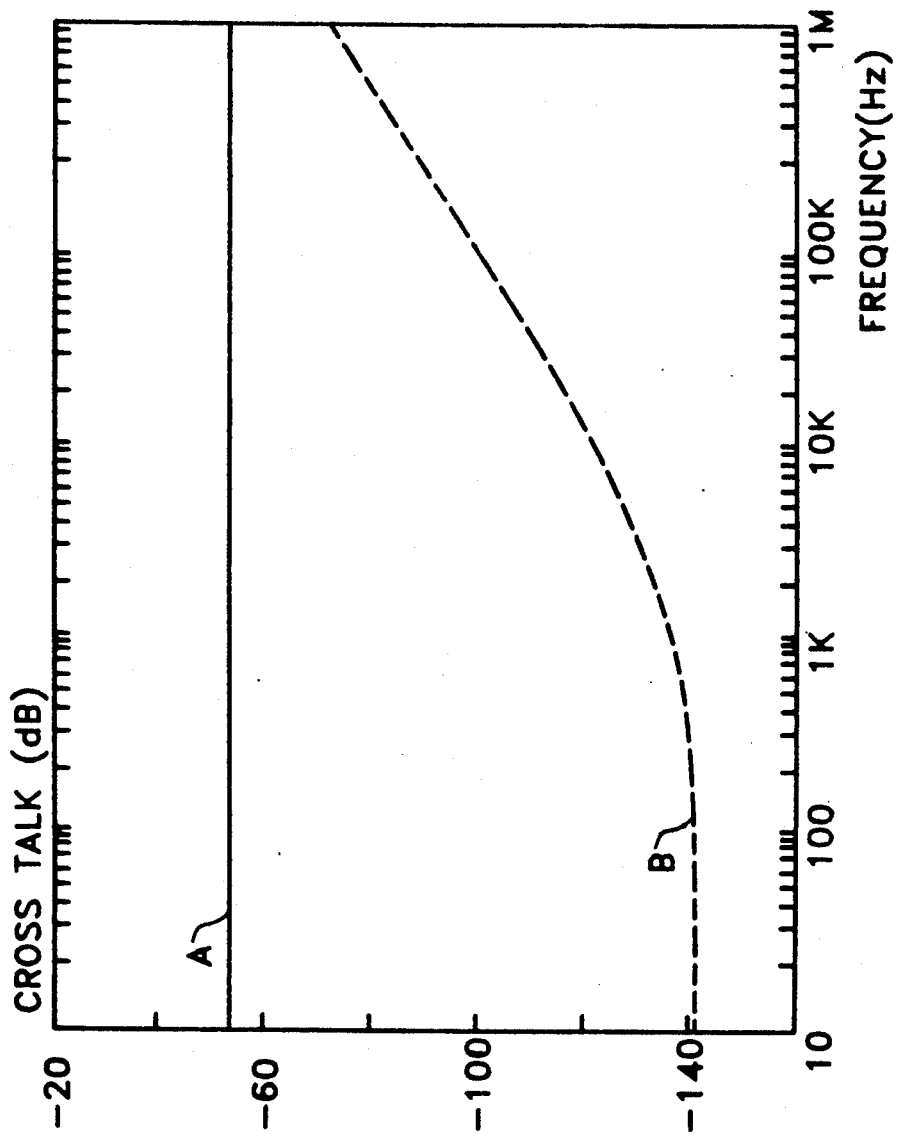
FIG. 5 is a graph for comparing the performance of an analog switch device according to the present invention with that of the conventional analog switch device.

FIG. 5 shows a graph for showing a comparison of a performance of the conventional analog switching device with that of the present invention, in which a solid line A indicates the conventional generated amount of crosstalk and a broken line B represents the generated amount of crosstalk of the present invention.

As shown in FIG. 5, it can be easily understood that the generated crosstalk amount obtained from the conventional analog switching device is considerably larger than that of the present invention. Comparing these crosstalk amounts for a frequency of 1 KHz, the unwanted input signal at the output of the conventional analog switching device is about one five-hundredth of its input amplitude, while that obtained using the analog switching device according to the present invention is about one ten-millionth of the input amplitude.

In comparing the relationship of the amount of crosstalk (in dB) to frequency in FIG. 5, the conventional switching device the amount of crosstalk due to parasitic capacitance is not affected by an increase frequency because it is relatively infinitesimal for comparison to the influence by a non-selected input port. In the present invention, the undesired input signal, i.e., pulse noise contributing to the amount of crosstalk due to parasitic capacitance, increases in proportion to an increasing frequency.

What is claimed is:

1. A crosstalk-resistant multi-input to single output analog switching device including an input stage having a plurality of input ports for receiving various analog input signals, a differential amplification unit connected to said input stage and having a plurality of differential amplifiers for amplifying said received analog input signals, a first selective switch unit connected to said differential amplification unit for performing a switching operation so that only one of said differential amplifiers is enabled and allows the corresponding analog input signal of said received analog input signals to be passed through the enabled differential amplifier transmitting it to an output stage, a first reference voltage source for supplying a first reference bias voltage to a first input of each of said differential amplifiers, a logic controller for controlling said first selective switch unit with its output signal, a constant current source coupled to the first selective switch unit and serving as a bias supply source to the differential amplification unit, and a common load connected to an output of the differential amplification unit for outputting the output of the differential amplification unit to the output stage, said analog switching device further comprising:

a second reference voltage source for supplying a second reference bias voltage to said first input of each of said differential amplifiers; and a second selective switch unit connected between said first and second reference voltage sources and said differential amplification unit and having a plurality of switch pairs, for performing a switch operation so that each bias voltage from said first and second reference voltage sources is selectively supplied to the corresponding differential amplifiers in response to the output signal of said logic controller.

2. The crosstalk-resistant multi-input to single-output analog switching device of claim 1, wherein a potential level of said second reference voltage source is the same as that of said first reference voltage source.

3. The crosstalk-resistant multi-input to single-output analog switching device of claim 1, wherein the plurality of switch pairs of said second selective switch unit are set up such that when one of said differential amplifiers is enabled by said first selective switch unit, one switch of the switch pair of said second selective switch unit, connected to the enabled differential amplifier, is turned o to be electrically connected to said first reference voltage source and the other switch of the switch pairs is turned off not to be electrically connected to said first reference voltage source and the other switch of the switch pair is turned off not to be electrically connected to said second reference voltage source, and one switch of each of the switch pairs of said second selective switch unit, connected to respective disabled differential amplifiers, is turned off not to be electrically connected to said first reference voltage source and the other switch of each of the switch pairs is turned off not to be electrically connected to said first reference voltage source and the other switch of each of the switch pairs is turned on to be electrically connected to said second reference voltage source.

4. The crosstalk-resistant multi-input to single-output analog switching device of claim 1, wherein a first switch of each switch pair of said second selective switch unit comprises a first switching transistor having its collector connected to the collector and its emitter connected to said differential amplification unit, and a second switching transistor having its collector connected to the base of said first switching transistor, its emitter grounded through a resistor and its base connected to said logic controller.

5. The crosstalk-resistant multi-input to single-output analog switching device of claim 4, wherein a second switch of each switch pair of said second selective switch unit comprises a third switching transistor having its collector connected to said second reference voltage source, its base connected to the collector and its emitter connected to said differential amplification unit, and a fourth switching transistor having its collector connected to the base of said third switching transistor, its emitter grounded through a resistor and its base connected to said logic controller.

6. The crosstalk-resistant multi-input to single-output analog switching device of claim 2, wherein the plurality of switch pairs of said second selective switch unit are set up such that when one of said differential amplifiers is enabled by said first selective switch unit, one switch of the switch pair of said second selective switch unit, connected to the enabled differential amplifier, is turned on to be electrically connected to said first reference voltage source and the other switch of the switch pair is turned off not to be electrically connected to said first reference voltage source and the other switch of each of the switch pair is turned off not to be electrically connected to said first reference voltage source and the other switch of each of the switch pairs is turned on to be electrically connected to said second reference voltage source.

7. The crosstalk-resistant multi-input to single-output analog switching device of claim 2, wherein a first switch of each switch pair of said second selective switch unit comprises a first switching transistor having its collector connected to said first reference voltage source, its base connected to the collector and its emitter connected to said differential amplification unit, and a second switching transistor having its collector connected to the base of said first switching transistor, its emitter grounded through a resistor and its base connected to said logic controller.

8. The crosstalk-resistant multi-input to single-output analog switching device of claim 3, wherein a first switch of each switch pair of said second selective switch unit comprises a first switching transistor having its collector connected to said first reference voltage source, its base connected to the collector and its emitter connected to said differential amplification unit, and a second switching transistor having its collector connected to the base of said first switching transistor, its emitter grounded through a resistor and its base connected to said logic controller.

9. The crosstalk-resistant multi-input to single-output analog switching device of claim 7, wherein a second switch of each switch pair of said second selective switch unit comprises a third switching transistor having its collector connected to said second reference voltage source, its base connected to the collector and its emitter connected to said differential amplification unit, and a fourth switching transistor having its collector connected to the base of said third switching transistor, its emitter grounded through a resistor and its base connected to said logic controller.

10. The crosstalk-resistant multi-input to single-output analog switching device of claim 8, wherein a second switch of each switch pair of said second selective switch unit comprises a third switching transistor having its collector connected to said second reference voltage source, its base connected to the collector and its emitter connected to said differential amplification unit, and a fourth switching transistor having its collector connected to the base of said third switching transistor, its emitter grounded through a resistor and its base connected to said logic controller.

11. The crosstalk-resistant multi-input to single-output analog switching device of claim 6, wherein a first switch of each switch pair of said second selective switch unit comprises a first switching transistor having its collector connected to said first reference voltage source, its base connected to the collector and its emitter connected to said differential amplification unit, and a second switching transistor having its collector connected to the base of said first switching transistor, its emitter grounded through a resistor and its base connected to said logic controller.

12. The crosstalk-resistant multi-input to single-output analog switching device of claim 11, wherein a second switch of each switch pair of said second selective switch unit comprises a third switching transistor having its collector connected to said second reference voltage source, its base connected to the collector and its emitter connected to said differential amplification unit, and a fourth switching transistor having its collector connected to the base of said third switching transistor, its emitter grounded through a resistor and its base connected to said logic controller.

* * * * *